United States Patent [19]
Morris

[11] Patent Number: 5,939,738
[45] Date of Patent: Aug. 17, 1999

[54] LOW BASE-RESISTANCE BIPOLAR TRANSISTOR

[75] Inventor: Frank J. Morris, Plano, Tex.

[73] Assignee: Texas Instruments Incorporated, Dallas, Tex.

[21] Appl. No.: 08/733,750

[22] Filed: Oct. 16, 1996

Related U.S. Application Data

[60] Provisional application No. 60/007,074, Oct. 25, 1995.

[51] Int. Cl.$^6$ .................. H01L 31/0328; H01L 31/0336; H01L 31/072; H01L 31/109
[52] U.S. Cl. ......................... 257/197; 257/198; 257/623
[58] Field of Search .................................... 257/197, 198, 257/623

[56] References Cited

U.S. PATENT DOCUMENTS

| | | | |
|---|---|---|---|
| 4,695,892 | 9/1987 | Kato et al. ............................ | 257/563 X |
| 4,746,626 | 5/1988 | Eda et al. .............................. | 257/198 X |
| 4,823,174 | 4/1989 | Itoh et al. ................................ | 257/198 |
| 4,896,203 | 1/1990 | Kajikawa ................................. | 257/197 |
| 5,147,775 | 9/1992 | Ota et al. ................................. | 437/31 |
| 5,757,039 | 5/1998 | Delaney et al. ...................... | 257/197 X |

OTHER PUBLICATIONS

R. J. Malik, et al., "Submicron Scaling of AlGaAs/GaAs Self–Aligned Thin Emitter Heterojunction Bipolar Transistors with Current Gain Independent of Emitter Area," *Electronics Letters*, vol. 25, No. 17, pp. 1175–1177, Aug. 17, 1989.

S. Tiwari, et al., "Surface Recombination in GaAlAs/GaAs Heterostructure Bipolar Transistors", *Journal of Applied Physics*, vol. 64, No. 10, pp. 5009–5012, Nov. 15, 1988.

Won–Seong Lee, et al., Effect of Emitter–Base Spacing on the current Gain of AlGaAs/GaAs Heterojunction Bipolar Transistors, IEEE Electron Device Letters, vol. 10, No. 5, May 1989.

Yoshiko Someya et al., Two–Dimensional Analysis of the Surface Recombination Effect on Current Gain for GaAlAs/GaAs HBTs, IEEE Transactions on Electron Devices, vol. 35, No. 7, Jul. 1988.

O. Nakajima, et al., "Emitter–Base Junction Size Effect on Current Gain $H_{fe}$ of AlGaAs/GaAs Heterojunction Bipolar Transistors", *Japanese Journal of Applied Physics*, vol. 24, No. 8, pp. L596–L598, Aug. 1985.

*Primary Examiner*—William Mintel
*Attorney, Agent, or Firm*—Michael K. Skrehot; Christopher L. Maginniss; Richard L. Donaldson

[57] ABSTRACT

A method for fabricating a bipolar transistor comprising the steps of: implanting portions 320 of a semiconductor material structure with ions to render the portions semi-insulating; forming an emitter contact region 332 at an exposed surface of a base layer 308 in a non-implanted portion of the material structure; forming an epitaxial layer of semiconductor material 322 over the exposed surface in an implanted portion of the material structure; and forming a base contact 330 over said epitaxial layer. In accordance with one embodiment of the invention, the method includes the further step of forming a second epitaxial layer of semiconductor material 324 over the first epitaxial layer 322 and then forming the base contact 330 on the second epitaxial layer 324. In accordance with another embodiment, the method includes the further step of forming a second layer of epitaxial material over the exposed surface prior to forming the epitaxial layer of semiconductor material. The base layer may be GaAs and the epitaxial of semiconductor material may be AlGaAs. The second epitaxial layer may also be GaAs.

8 Claims, 8 Drawing Sheets

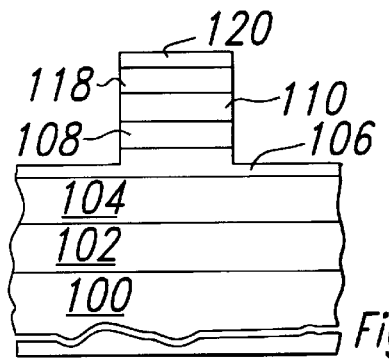
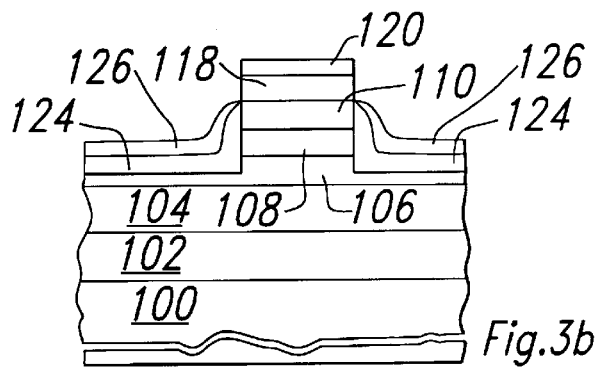
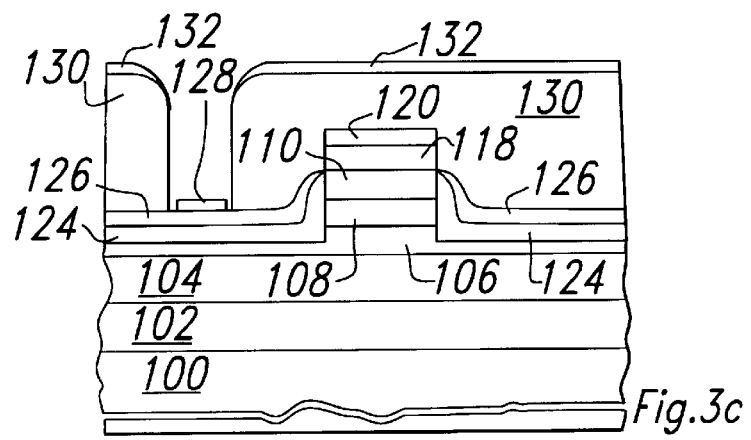
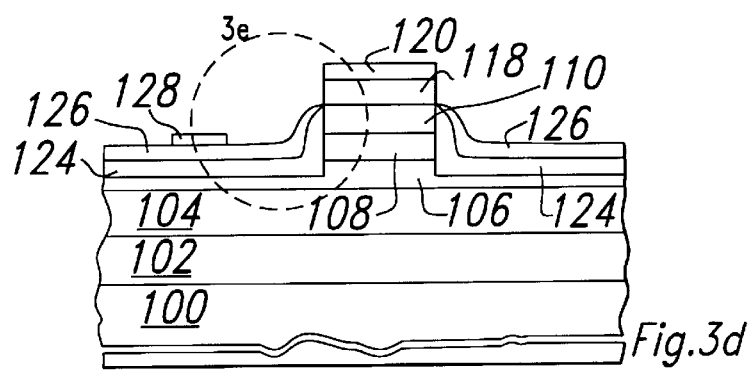
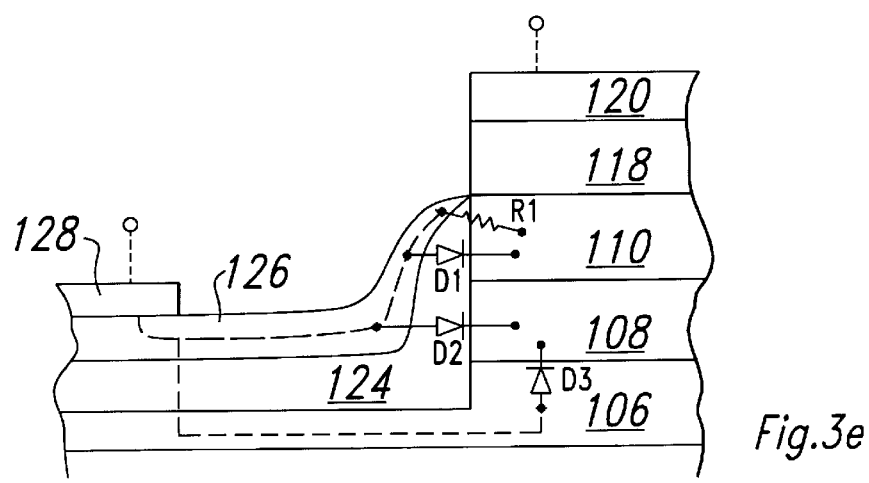

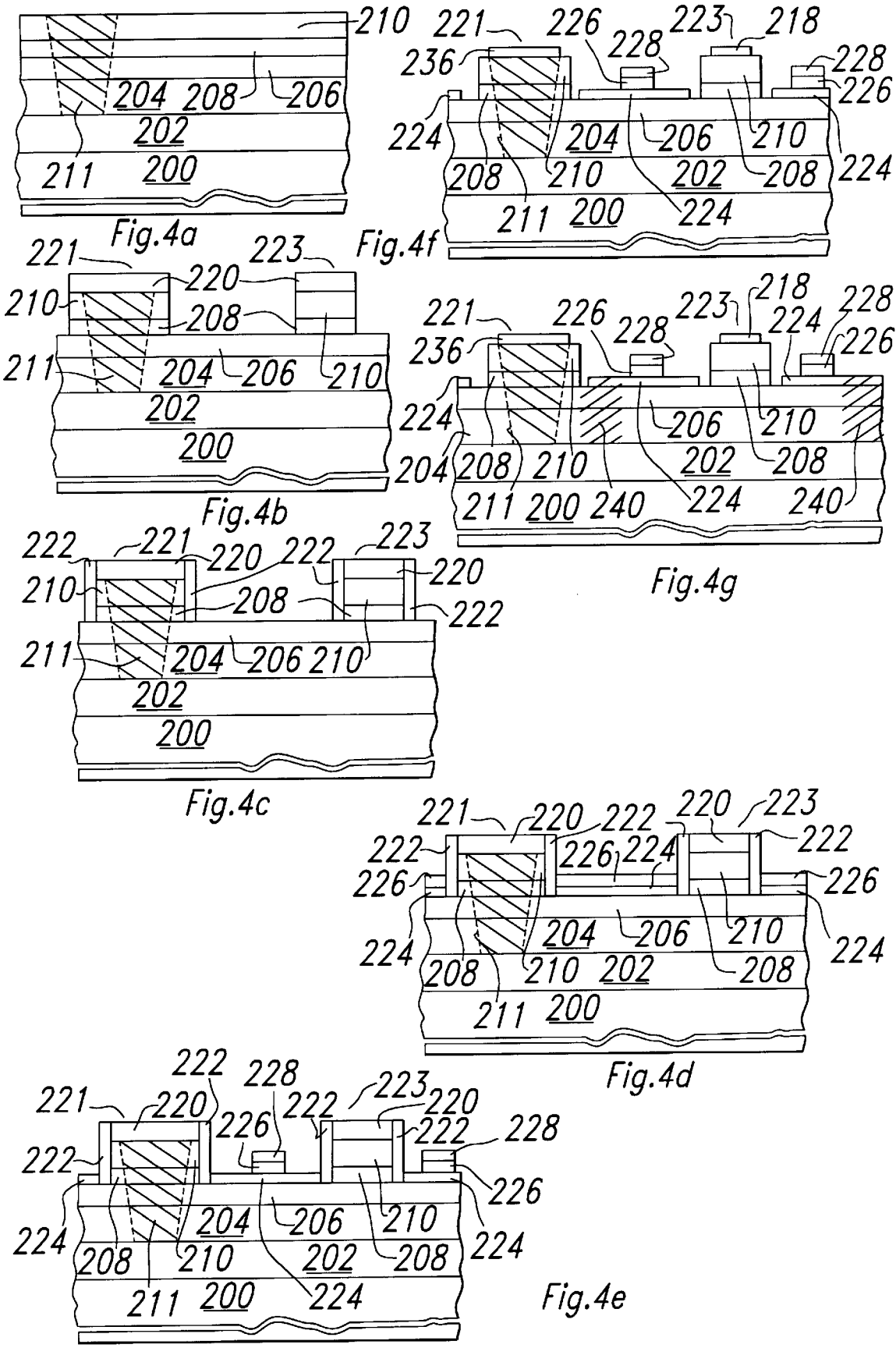

LOW BASE-RESISTANCE BIPOLAR TRANSISTOR

CROSS REFERENCE TO RELATED APPLICATIONS

This application includes subject matter that is related to U.S. patent application Ser. No. 08/733,752, filed Oct. 16, 1996, and this application claims benefit of provisional application No. 60/007,074 filed Oct. 25, 1995.

FIELD OF THE INVENTION

This invention relates generally to semiconductor devices, and more specifically to heterojunction bipolar transistors.

BACKGROUND OF THE INVENTION

Heterojunction bipolar transistors (HBTs) are attractive devices for such applications as amplifiers for personal communications and radar systems, and as switching devices in products such as analog-to-digital converters. The maximum frequency of oscillation of GaAs-based HBTs can be five times higher than that of silicon bipolar transistors. In addition, since HBTs are vertical devices, they possess a superior packing density as compared to GaAs MESFETs. Despite these advantages over silicon bipolar and even GaAs FET technologies, GaAs-based HBTs have been shown to suffer from a lower current gain than should be expected from this type of device.

A typical prior-art mesa HBT is shown in FIG. 1a. In mesa HBTs the base metal contact 10 is placed as close to the emitter contact 12 as possible in order to reduce the extrinsic base resistance. The extrinsic base is the portion of the base layer 14 that lies outside the bounds of the emitter layer 16. In general, the closer the base contacts 10 are to the emitter 16, the lower the base resistance. While this approach can lower the base resistance of a transistor, it can also result in reduced HBT current gains. The base ohmic contact 10 represents an infinite surface recombination velocity for carriers injected from the emitter 16, resulting in an increase in the base current and a reduction in current gain. It has been shown that the HBT current gain decreases as the lateral spacing between the base contact 10 and the emitter contact 12 is decreased below approximately 1 $\mu$m. See Won-Seong Lee, et al., *Effect of Emitter-Base Spacing on the Current Gain of AlGaAs/GaAs Heterojunction Bipolar Transistors*, IEEE Electron Device Letters, Vol. 10, No. 5, May 1989, and Yoshiko Someya, et al., *Two-Dimensional Analysis of the Surface Recombination Effect on Current Gain for GaAlAs/GaAs HBTs*, IEEE Transactions on Electron Devices, Vol. 35, No. 7, July 1988.

The transistor current gain is also dependent upon base layer doping and thickness. For high current gains, the base layer is generally lightly doped and very thin. This configuration contrasts with the need to have low base resistance, which generally requires high base layer doping and a thicker base layer. The practice of moving the base contact metallization further from the emitter contact for improved current gains is not suitable in transistors having lightly doped base layers because of the unacceptable increase in extrinsic base resistance. A compromise is usually made between these conflicting requirements.

In the past, efforts have been made to increase transistor current gain by minimizing the recombination at the extrinsic base surface 18. In these approaches a physical or chemical passivation treatment is applied to the surface of the base layer of the HBT. See O. Nakajima, et al., "Emitter-Base Junction Size Effect on Current Gain $H_{fe}$ of AlGaAs/GaAs Heterojunction Bipolar Transistors", *Japanese Journal of Applied Physics*, Vol. 24, No. 8, pp. L596–L598, Aug. 1985; R. J. Malik, et al., "Submicron Scaling of AlGaAs/GaAs Self-aligned Thin Emitter Heterojunction Bipolar Transistors with Current Gain Independent of Emitter Area", *Electronics Letters*, Vol. 25, No. 17, pp. 1175–1177, Aug. 17, 1989; S. Tiwari, et al., "Surface Recombination in GaAlAs/GaAs Heterostructure Bipolar Transistors", *Journal of Applied Physics*, Vol. 64, No. 10, pp. 5009–5012, Nov. 15, 1988. In Lee, supra, a ledge of AlGaAs 30, part of the emitter 26 of the HBT, is left between the emitter 26 and base contact 20 to passivate the surface of the base layer 24 as shown in FIG. 1b. The wider this AlGaAs passivating ring (up to about 1 $\mu$m in width), the higher the HBT current gain. However, this passivating AlGaAs ring increases the space between the base 20 and emitter 22 contacts with a corresponding increase in the base extrinsic resistance. Consequently, there is a need in the industry for transistors, and processes for making such transistors, that address these shortcomings of the prior art

SUMMARY OF THE INVENTION

In accordance with the principles of the present invention, there is disclosed herein a method for fabricating a bipolar transistor comprising the steps of: implanting portions of a semiconductor material structure with ions to render the portions semi-insulating; forming an emitter contact region at an exposed surface of a base layer in a non-implanted portion of the material structure; forming an epitaxial layer of semiconductor material over the exposed surface in an implanted portion of the material structure; and forming a base contact over the epitaxial layer. In accordance with one embodiment of the invention, the method includes the further step of forming a second epitaxial layer of semiconductor material over the first epitaxial layer and then forming the base contact on the second epitaxial layer. In accordance with another embodiment, the method includes the further step of forming a second layer of epitaxial material over the exposed surface prior to forming the epitaxial layer of semiconductor material. The base layer may be GaAs and the layer of wide bandgap semiconductor material may be AlGaAs. The second epitaxial layer may also be GaAs.

In another embodiment of the invention, a bipolar transistor is disclosed comprising: an emitter contact region at an exposed surface of a base layer; semi-insulating regions adjacent the emitter contact region; an epitaxial layer of wide bandgap semiconductor material over the semi-insulating regions; and a base contact over the wide bandgap semiconductor material layer. In one embodiment the transistor further comprises a second epitaxial layer of semiconductor material interposed between the layer of wide bandgap material and the base contact. In another embodiment, the transistor further comprises a second epitaxial layer of semiconductor material interposed between the semi-insulating regions and the layer of wide bandgap material. In these embodiments, the base layer may be GaAs and the wide bandgap material may be AlGaAs. An advantage of the invention is that it permits a reduction in base-collector capacitance without the increase in base resistance that normally occurs with ion implantation processes.

BRIEF DESCRIPTION OF THE DRAWINGS

The foregoing features of the present invention more fully understood from the following detailed description, read in conjunction with the accompanying drawings, wherein:

FIG. 2a is a cross-sectional diagram of a material structure used in a first preferred embodiment process;

FIG. 2b is a detailed cross-sectional diagram of layer 110 in the material structure shown in FIG. 2a;

FIGS. 3a–3d are cross-sectional diagrams of a transistor at various stages of a modified first preferred embodiment process;

FIG. 3e is an enlarged view of a portion of FIG. 3d, including schematic depictions of various parasitic diodes and resistances;

FIGS. 4a–4g are cross-sectional diagrams of a transistor at various stages in a fourth preferred embodiment process;

DETAILED DESCRIPTION OF PREFERRED EMBODIMENTS

Extrinsic Base Regrowth

Prior art transistors typically suffer from low current gain due to a high degree of recombination at the surface of the extrinsic base region. The base ohmic contact represents an infinite surface recombination center for electrons that are injected from the emitter to the extrinsic base region. These recombined electrons increase the base current and therefore reduce the HBT current gain. The current gain in an HBT decreases as the lateral spacing between the base contact and the emitter contact is decreased below about 1 $\mu$m; so, merely moving the base contacts closer to the emitter mesa does not completely solve the problem of low current gain.

The use of an AlGaAs passivation layer between the base and emitter contact has been shown to improve transistor current gain, although it is difficult to obtain this passivation in mesa HBTs as the base-to-emitter contact spacing is reduced. Additionally, some prior processes that use an AlGaAs passivation layer require an implantation anneal procedure (800–850° C.) that significantly reduces the current gains for heavily doped base layers. See, for example, U.S. Pat. No. 5,223,449 to Morris, et al. The embodiment process described hereinbelow offers a means to passivate the extrinsic base region of an HBT without requiring a high temperature anneal step.

Figure 1A:
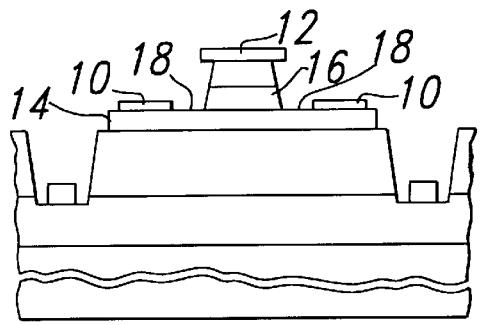
FIGS. 1a and 1b are cross-sectional diagrams of prior art heterojunction bipolar transistors.
Figure 1B:
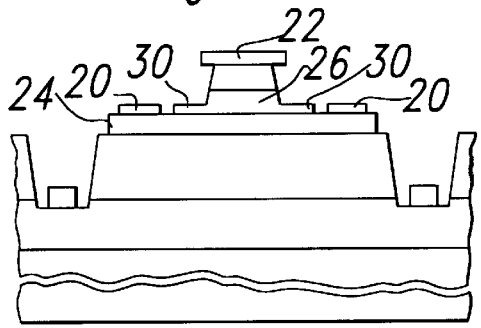
Figures 2A, 2B:
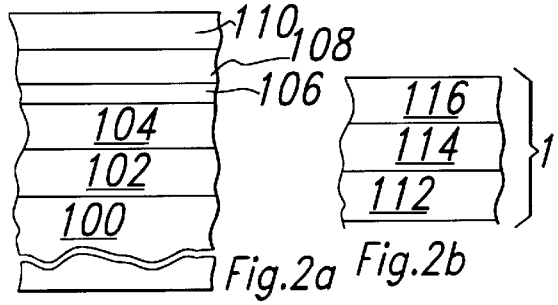

The aspects of the invention may be better understood by reference to a first preferred embodiment process. The process begins with the growth of an epitaxial material structure on a semiconductor substrate 100 of GaAs or InP, for example, as shown in FIG. 2a. Table I further describes the material structure shown in FIG. 2a.

TABLE I

| Element | Generic Name | Preferred Material | Examples of Alternate Materials | Approximate Layer Thickness | Approximate Doping (cm$^{-3}$) |
|---|---|---|---|---|---|
| 110 | Emitter cap | GaAs | InGaAs | 700Å | n 1 × 10$^{19}$ |
| 108 | Emitter | AlGaAs | | 1000Å | n 5 × 10$^{17}$ |
| 106 | Base | GaAs | | 800Å | p 2 × 10$^{19}$ |
| 104 | Collector | GaAs | | 1 $\mu$m | n 2 × 10$^{16}$ |
| 102 | Subcollector | GaAs | | 1 $\mu$m | n 2 × 10$^{18}$ |

Emitter cap layer 110 can be n$^+$ GaAs as described in Table I, or any combination of n$^-$GaAs, n$^+$GaAs and InGaAs. For example, the emitter cap layer 110 may comprise of the structure shown in FIG. 2b, and further described in Table II. N-type dopants may include silicon, tin, sulfur, and so forth, while p-type dopants may include carbon, beryllium, zinc, and so forth.

TABLE II

| Element | Generic Name | Preferred Material | Approximate Layer Thickness | Approximate Doping (cm$^{-3}$) |
|---|---|---|---|---|
| 116 | Upper sublayer | InGaAs | 700Å | n 1 × 10$^{19}$ |
| 114 | Middle sublayer | GaAs | 1000Å | n 2 × 10$^{18}$ |
| 112 | Lower sublayer | GaAs | 1000Å | n 5 × 10$^{17}$ |

The remainder of the process is described below with reference to self-aligned techniques, it may be appreciated that the techniques are also applicable to non-self-aligned processes.

Figure 2C:
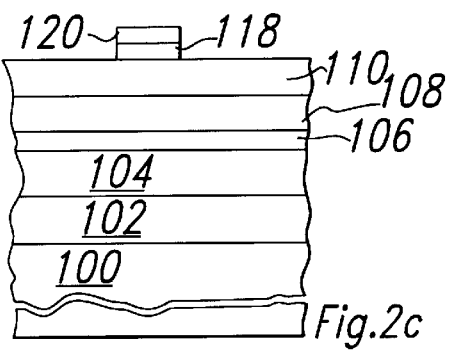
FIGS. 2c–2l are cross-sectional diagrams of a transistor at various stages in a first preferred embodiment process.
Figure 2D:
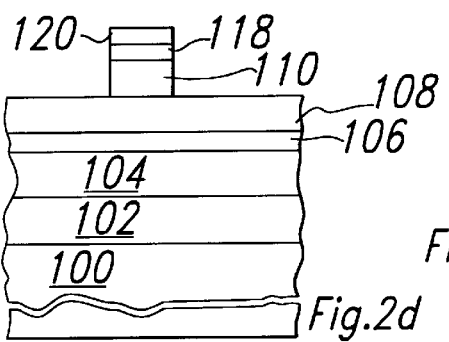

As shown in FIG. 2c, a refractory metal emitter contact 118 such as tungsten silicide (WSi$_2$), for example, is deposited on the material structure shown in FIG. 2a. A layer of dielectric 120, such as a low temperature plasma oxynitride, oxide, or nitride, is then deposited to cover the refractory metal contact 118. The combination of refractory metal 118 and dielectric 120 can be deposited and defined using conventional photoresist lift-off, or by depositing, photoresist patterning, and etching using either wet or plasma etch processes. For a first case in which photoresist lift-off is used rather than patterning and etching, the deposited dielectric 120 is sufficiently thick (in the range of approximately 5000 Å–10,000 Å) to withstand the subsequent plasma etch processes to be described. For a second case where the refractory metal contact 118 and dielectric 120 are patterned and etched, rather than lifted off, defining photoresist (not shown) is patterned to cover the top dielectric 120. The defining photoresist acts as a mask during the plasma etch processes. Consequently, the dielectric thickness can be in the range of approximately 3000 Å to 7000 Å.

The refractory metal contact 118 and dielectric 120 are used as an etch mask during the removal of the emitter cap layer 110. The removal of the emitter cap layer 110 is performed in two steps. First, the InGaAs upper sublayer 116 is etched using an acid solution such as H$_2$SO$_4$:H$_2$O$_2$:H$_2$O in a ratio of 1:8:160 by volume. This wet etch step is followed by a plasma etch that selectively removes the top GaAs layers 112 and 114, while not etching the AlGaAs emitter layer 108. Typical plasma etch gases are a combination of BCl$_3$ and SF$_6$. The resulting structure is shown in FIG. 4.

Figure 2E:
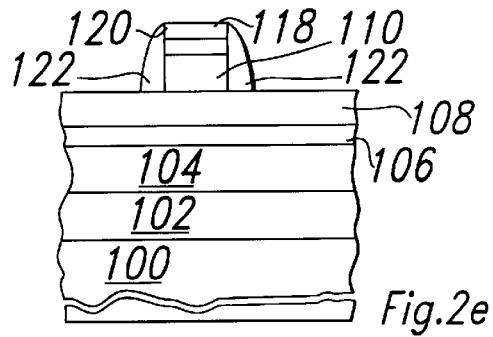

In FIG. 2e, a conventional nitride (Si$_3$N$_4$) process has been performed to create sidewall spacers 122. The sidewall spacers are formed as follows. After cleaning the wafers, including removing any photoresist remaining from the abovementioned process steps, a second dielectric 122, such as silicon nitride, is deposited to a thickness in the range of approximately 2000 Å to 9000 Å over the wafers, covering the initial dielectric 120, the sidewalls of the etched regions 110, and the exposed AlGaAs 108. The wafers are then etched in a low pressure plasma in a reactive ion etching (RIE) apparatus using $CHF_3/O_2$ or $CF_4/O_2$ for example. The etch conditions are adjusted such that the etch is anisotropic, thereby resulting in the etching of the dielectric on the horizontal surfaces prior to that of the dielectric on the side walls. The thickness of the initial dielectric 120 is enough to ensure that the dielectric is not completely removed during this etch step.

Figure 2F:
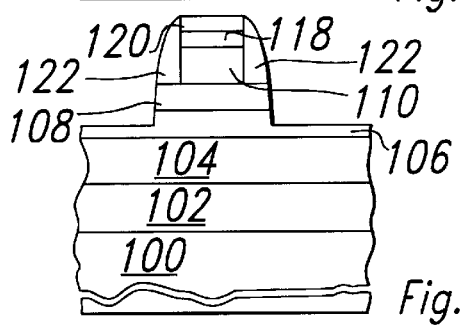

The structure of FIG. 2e is etched to remove the emitter layer 108 from regions not covered by the nitride sidewalls and the stack comprising the emitter cap layer 110, the refractory metal layer 118, and the dielectric layer 120. The etch process is essentially self-aligned to the nitride, but some undercutting of the nitride is likely to occur. The etch is timed such that a minimum of the base layer is removed. Using an etch solution such as 1:8:160 $H_2SO_4:H_2O_2:H_2O$, which removes AlGaAs and GaAs at approximately 40 Å/second at room temperature, the AlGaAs layer 110 can be removed in about 25 to 30 seconds. Hence, an emitter contact region surrounded by the exposed base layer 106 is forced as shown in FIG. 2f.

Figure 2G:
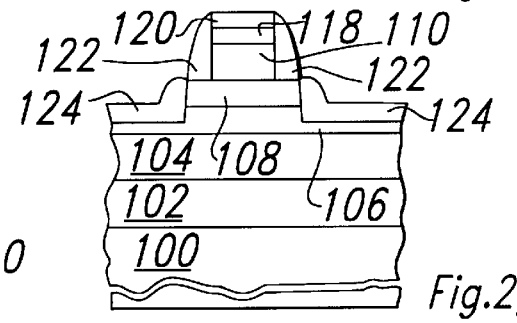
Figure 2H:
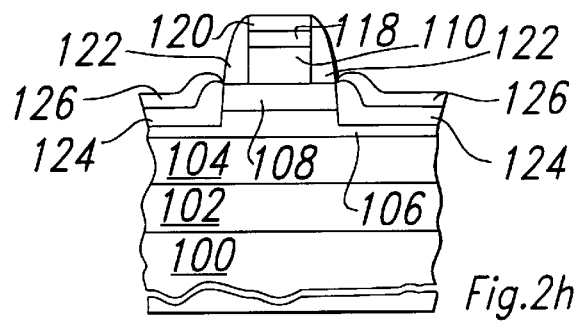

At this point in a conventional process, base contact metal would be deposited on base layer 106. In the embodiment process, the wafers are first cleaned in a solvent such as acetone, followed by $HCl:H_2O$ and $NH_4OH:H_2O$ etches. A selective epitaxial growth of a doped (in the range of approximately $1\times10^{16}$ $cm^{-3}$ to $1\times10^{19}$ $cm^{-3}$) wide bandgap passivation layer 124, of p-AlGaAs for example, is then performed on the unprotected surfaces of the structure as shown in FIG. 2g. A heavily doped base contact layer 126, of $p^+$ GaAs for example, is then selectively grown over the passivation layer 124 as shown in FIG. 2h. The epitaxial growth is performed with a common technique such as molecular beam epitaxy (MBE), metal-organic chemical vapor deposition (MOCVD), or metal-organic molecular beam epitaxy (MOMBE). The growth temperatures are typically lower than 650° C., a temperature at which the HBT current gain is not likely to be adversely affected. The base contact layer 126/passivation layer 124 overgrowth forms a low resistance base contact region. The increased thickness of the extrinsic base region prevents or minimizes the base metal spiking through the base to the n-collector layer 104. The p-AlGaAs minimizes the injection of electrons from the n-AlGaAs emitter layer and hence results in an increase in the current gain of the transistor.

Figure 2I:
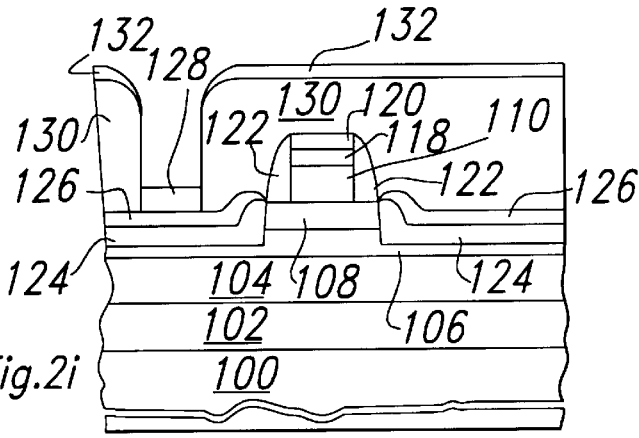
Figure 2J:
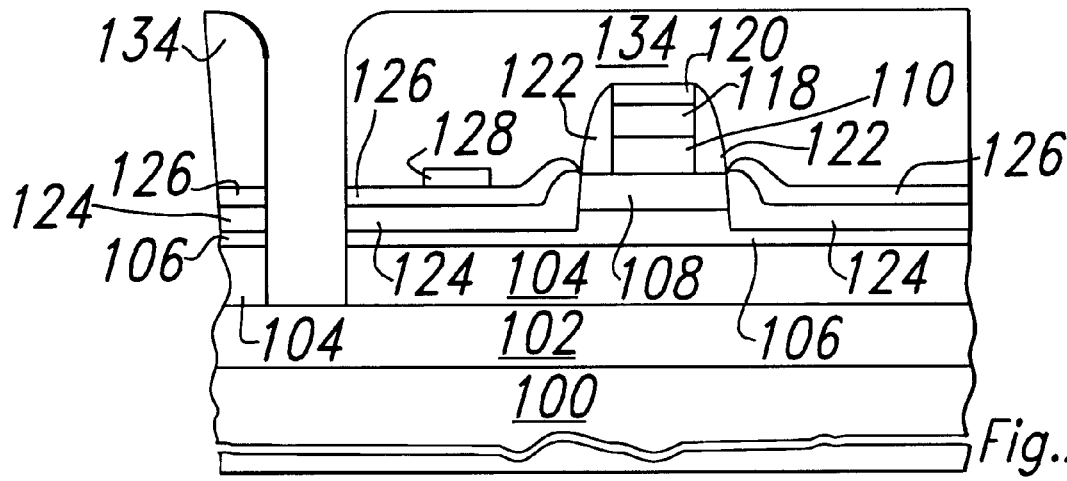
Figure 2K:
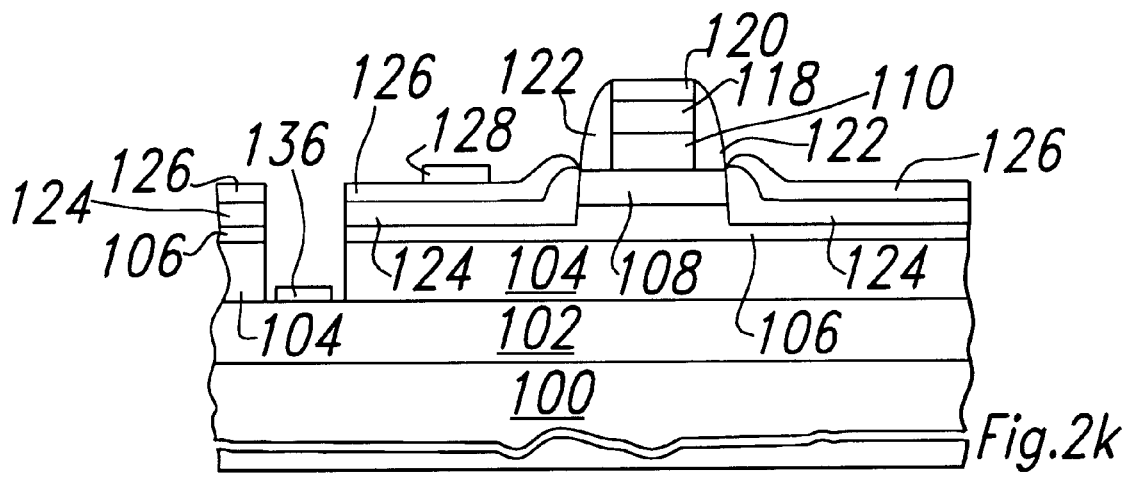
Figure 2L:
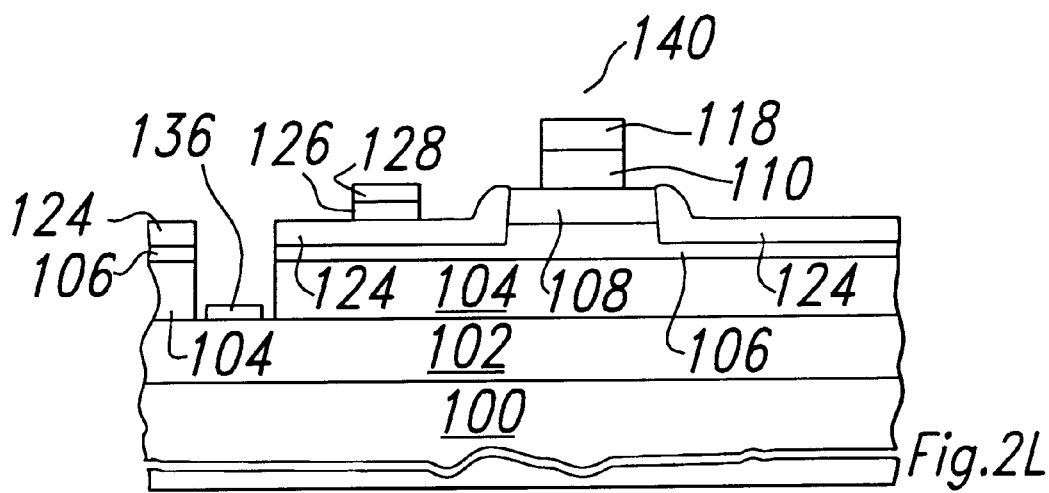

Referring now to FIG. 2i, ohmic base contacts 128, of Au/AuZn/Au for example, are then formed on the base contact layer 126 using a conventional liftoff process in which photoresist 130 is deposited and patterned to expose a portion of layer 126. Photoresist 130 and excess contact metallization 132 is then removed. Following the formation of base contact 128, the structure is covered with photoresist 134, which is then patterned as shown in FIG. 2j. The portions of the base contact layer 126, the passivation layer 124, the base layer 106, and the collector layer 104 not covered by photoresist 134 are then removed. Collector contact 136 is then formed in a lift-off process similar to that described above for the base contact formation. The resulting structure is shown in FIG. 2k. Dielectric layer 120 and nitride sidewalls 122 are removed. The portions of base contact layer 126 not covered by base contact metallization 128 may also be removed in an etch that uses the AlGaAs passivation layer 124 as an etch stop. The completed transistor is shown in FIG. 2l. Removal of layers 124 and 126 from areas outside the immediate transistor region (not shown) can be accomplished by photoresist patterning and etching in a solution of 1:8:160, if desired. Interconnecting metallization, resistors, capacitors and other devices may be formed using conventional techniques.

The first preferred embodiment process described above and the embodiments described hereinbelow utilize a self-aligned refractory emitter contact. A non-self-aligned emitter contact that is aligned and deposited after the epitaxial growth of the extrinsic base regions 124 and 126 is an alternative method for emitter formation in the embodiments. For the non-self-aligned emitter contact process, the refractory metal layer 118 is omitted from the structure of FIG. 2c, and only the nitride layer 120 is used to prevent regrowth of the extrinsic base layers 124 and 126 over the emitter areas. After the epitaxial growth process, the emitter contact can be patterned onto the emitter area, the nitride etched in this region, and the emitter contact deposited and lifted off as described herein above for the base ohmic contact metal of the first preferred embodiment process.

The first preferred embodiment process as described above relates to npn bipolar transistors. It may be appreciated that the process applies equally to pnp transistors. The material structure for a pnp transistor differs in that the emitter and collector layers are p-doped, rather than n-doped as described above, and the base layer is n-doped, rather than p-doped. The inventive process offers particular advantage to the pnp transistor in that the typical base layer is thinner in a pnp transistor than in an npn transistor. Hence, it is typically more difficult to etch down through a typical pnp transistor emitter layer and stop on the thinner base layer without etching through the base layer. Through the use of overgrown layers 124 and 126, the first preferred embodiment process increases the thickness of the base contact area, thereby making it easier to form the base contacts, as well as lowering the extrinsic base resistance of the transistor.

In a second preferred embodiment process, the passivation layer 124 is eliminated. The base contact layer 126 is deposited directly on the base layer 106, rather than on a prior-deposited layer 124. This embodiment is applicable to situations where it is desired to simply increase the thickness of the extrinsic base for lower resistance or to simplify the base contact process and minimize the possibility of base metal 128 spiking through the base layer 106 into the underlying layers.

In a third preferred embodiment process, the sidewall spacers 122 are eliminated from the emitter contact region to simplify the process. The third embodiment process begins similarly to the first embodiment, with the following epitaxial layers: subcollector 102, collector 104, base 106, emitter 108, emitter cap 110, the refractory self-aligned emitter contact 118 and nitride cap layer 120. The transistor's emitter contact region is defined with photoresist followed by a combination of wet and dry etch processes as in the first embodiment process, yielding the structure in FIG. 3a. The wafers are cleaned by ashing in an $O_2$, NO, $O_2$ and Ar plasma, followed by etching in HCl and cleaning in $NH_4OH$. A selective epitaxial growth of a doped (in the range of approximately $1\times10^{16}$ $cm^{-3}$ to $1\times10^{20}$ $cm^{-3}$) wide bandgap passivation layer 124, of p-AlGaAs for example, is performed on the unprotected surfaces of the structure as shown in FIG. 3b. A heavily doped base contact level 126, of p+ GaAs for example, is then selectively grown over the passivation level 124 as in the first embodiment. The base ohmic contact metal system, of Ti/Pt/Au, Au/AuZn/Au, or a similar composition of metals, is applied as described for the first preferred embodiment and as shown in FIGS. 3c and 3d.

The omission of nitride sidewalls introduces additional parasitic current paths between the emitter contact and the base contact as illustrated in FIG. 3d and 3e. The resistance labeled R1, along with the dashed lines, represent any leakage path between the emitter contact, top contact layer 110, and the base contact 128. After forming the metal contacts, this leakage resistance can be eliminated by a short plasma etch using $BCl_3$ and $SF_6$, which etches the GaAs cap layer 126 without etching the AlGaAs passivation layer 124. Since AlGaAs is a wide bandgap semiconductor, the remaining parasitic diodes D1 and D2 have a higher turn-on voltage than the HBT emitter-base junction D3 and therefore do not cause excessive leakage. The remainder of the process for the third embodiment is the same as that for the first embodiment described above.

A fourth preferred embodiment process is shown in FIGS. 4a–4g. The process begins with a material structure similar to that described above for the first embodiment process. Substrate 200 may be GaAs, InP, or a similar semiconductor material. The fourth embodiment process is described for a pnp transistor, but one skilled in the art may also appreciate that the process applies equally well to an npn transistor.

TABLE II

| Element | Generic Name | Preferred Material | Examples of Alternate Materials | Approximate Layer Thickness | Approximate Doping $(cm^{-3})$ |
|---|---|---|---|---|---|
| 210 | Emitter cap | GaAs | InGaAs | 700Å | p $1 \times 10^{19}$ |
| 208 | Emitter | AlGaAs | | 1000Å | p $5 \times 10^{17}$ |
| 206 | Base | GaAs | | 800Å | n $2 \times 10^{19}$ |
| 204 | Collector | GaAs | | 1 μm | p $2 \times 10^{16}$ |
| 202 | Subcollector | GaAs | | 1 μm | p $2 \times 10^{18}$ |

The material structure is subjected to implantation of beryllium, zinc, or a similar p-type dopant to form region 211. When annealed at an appropriate temperature (in the range of approximately 500 to 850° C.), the implanted region extends from the subcollector layer 202 to the surface of the material structure as shown in FIG. 4a. A mask of a material 220 such as silicon nitride is deposited on the surface of the material structure. The emitter cap 210 and emitter 208 layers are then partially etched away as shown in FIG. 4b to form a collector mesa 221 and an emitter mesa 223. A material such as silicon nitride 222 may be formed on the sidewalls of the mesas 221 and 223 as shown in FIG. 4c. This step is optional, but if sidewalls are not used, care must be taken in subsequent overgrowth steps to prevent the formation of undesired parasitic diodes at the edges of the mesas.

In FIG. 4d, a selective epitaxial growth of a moderately doped wide bandgap passivation layer 224, of n-AlGaAs for example, is performed on the unprotected surfaces of the structure in FIG. 4c. A heavily doped base contact layer 226, of n+ GaAs for example, is then selectively grown over the passivation layer 224. Base contacts 228 are formed on contact layer 226. The base contact metal system can be a non-alloy system such as sequential layers of Ti, Pt, and Au, or an alloyed contact system comprising Au, Ge, and Ni, for example. Contact layer 226 then may be selectively removed from regions not covered by base contacts 228, as shown in FIG. 4e. In FIG. 4f, masking layer 220 and sidewalls 222 are removed. Collector contact 236 and emitter contact 218 are then formed on the collector 221 and emitter 223 mesas, respectively. As may be appreciated from inspection of FIG. 4f, the surface of the transistor structure is quasi-planar, which provides significant advantages for patterning and etching the subsequently deposited metal interconnect system. Implantation of a material such as boron, for example, in regions 240, shown in FIG. 4g, renders those regions semi-insulating, thereby reducing parasitic capacitance in the transistor and improving the base-collector breakdown voltage of the device. The implantation energy is selected to be sufficient to reach the top of subcollector layer 202 without substantially penetrating that layer. For example, a typical combination of implants used to achieve the desired depth is the following: an implantation dose of approximately $4.0 \times 10^{11}$ $cm^{-2}$ at an energy of about 50 keV; an implantation dose of approximately $2 \times 10^{12}$ $cm^{-2}$ at an energy of about 100 keV; and an implantation dose of approximately $2 \times 10^{13}$ $cm^{-2}$ at an energy of about 200 keV.

Implantation Prior to Epitaxial Regrowth

Many methods have been proposed for reducing the base-collector capacitance in HBTs. In one such method, ion implantation of a material such as boron, oxygen, or protons is performed through the extrinsic base of the transistor (i.e. the portion of the base not covered by the emitter mesa) into the underlying collector layer. The resulting implant damage converts the doped collector material to a semi-insulating material, thus reducing the capacitance between the base and collector of the HBT. A disadvantage of this technique is that the implant also damages the base layer as it penetrates through that layer on its way to the collector layer. While this damage does not convert the base layer to semi-insulating material, it increases the base sheet resistance, which can significantly degrade the desired high-frequency performance of the transistor.

Figure 5A:
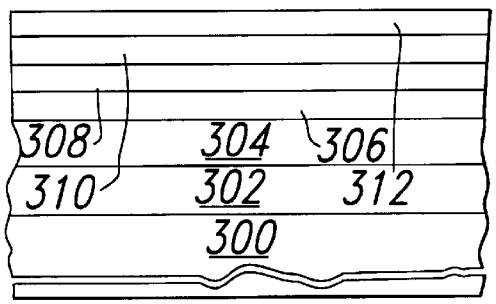
FIGS. 5a–5k are cross-sectional diagrams of a transistor at various stages in a fifth preferred embodiment process.

A fifth preferred embodiment method avoids the above-mentioned problems of the prior art methods by performing the damaging implant prior to the deposition of the final extrinsic base layers. As in the embodiments described hereinabove, the fifth preferred embodiment process begins with a material structure such as that shown in FIG. 5a and further described in Table III.

TABLE III

| Element | Generic Name | Preferred Material | Examples of Alternate Materials | Approximate Layer Thickness | Approximate Doping $(cm^{-3})$ |
|---|---|---|---|---|---|
| 312 | Ohmic contact | InGaAs | | 700Å | n $1 \times 10^{19}$ |
| 310 | Emitter cap | GaAs | InGaAs | 700Å | n $1 \times 10^{19}$ |
| 308 | Emitter | AlGaAs | | 1000Å | n $5 \times 10^{17}$ |
| 306 | Base | GaAs | | 800Å | p $2 \times 10^{19}$ |
| 304 | Collector | GaAs | | 1 μm | n $2 \times 10^{16}$ |
| 302 | Subcollector | GaAs | | 1 μm | n $2 \times 10^{18}$ |

Figure 5E:
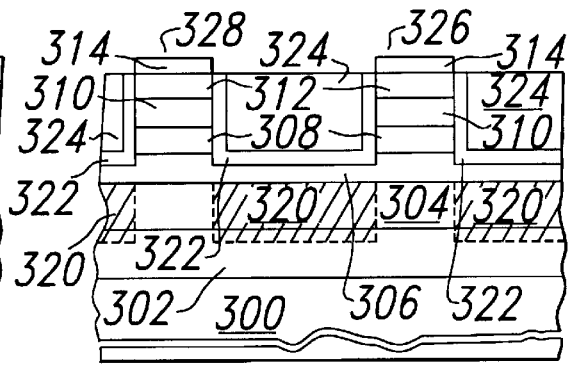
Figure 5B:
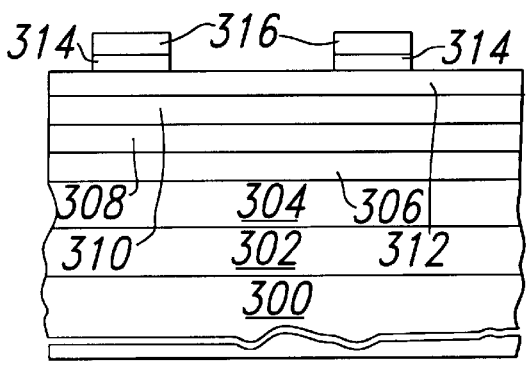
Figure 5F:
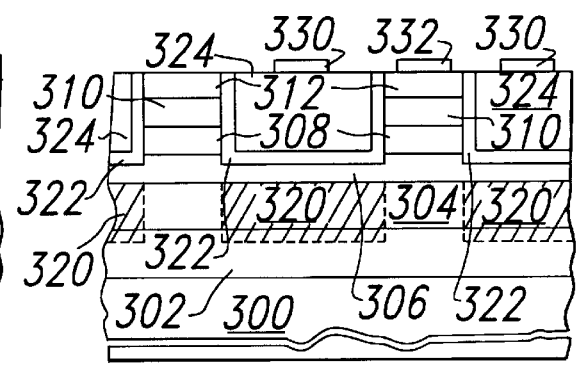
Figure 5C:
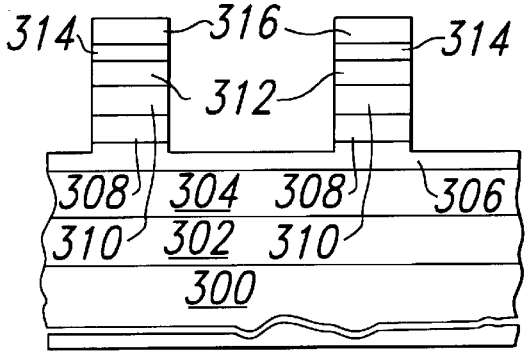

First, the wafers are covered with a dielectric such as plasma deposited silicon nitride 314. Photoresist 316 is deposited and patterned such that the nitride 314 may be removed from all areas except those where the emitter and collector contacts of the transistor are to be formed, as shown in FIG. 5b. The layers overlying the base layer 306 are then removed as shown in FIG. 5c. The material may be removed with conventional wet and dry etching processes. First, the InGaAs cap layer 312 is etched using an acid solution such as $H_2SO_4:H_2O_2:H_2O$ (1:8:160 by volume). This etch is followed by a plasma etch that selectively etches the top GaAs layer 310 while not etching the AlGaAs emitter layer 308. Typical plasma etch gases are a combination of $BCl_3$ and $SF_6$. The emitter layer 308 is then removed to expose the base layer 306. A wet etch such as 1:8:160 may be used for the removal. It may be appreciated that it is not essential for the etching process to stop exactly at the interface between the emitter 308 and base 306 layers since a new extrinsic base layer is to be deposited in subsequent process steps. Moreover, the base layer 306 may be completely etched through since the subsequently deposited extrinsic base layer can be formed to make electrical contact to the original base layer 306 at the edges of the mesas shown in FIG. 5c.

Figure 5G:
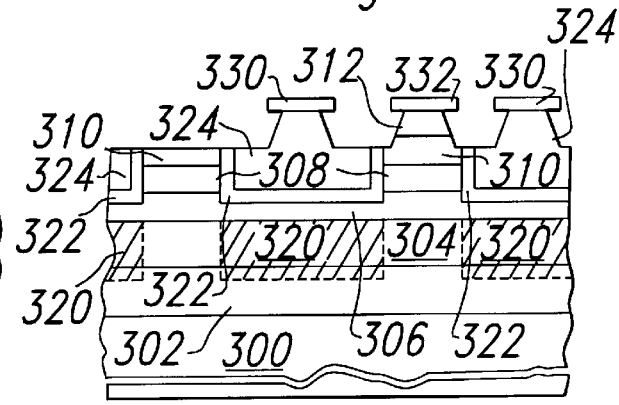
Figure 5D:
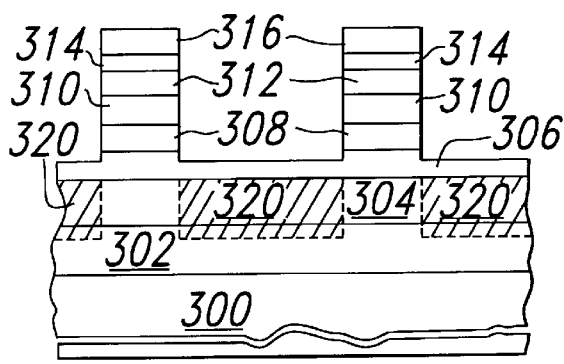

In FIG. 5d, regions 320 not covered by photoresist 316 are implanted with oxygen, for example, at an energy in the range of approximately 150 keV to 2 MeV to damage the collector layer 304 that lies beneath the extrinsic portion of the base layer 306. The damaged collector layer is rendered semi-insulating. Photoresist 316 and nitride 314 have sufficient thickness (approximately 2 to 4 $\mu$m) to block the damaging implant from reaching the underlying mesas. Oxygen is particularly elective as the implant material because the damage to the semiconductor layers that results from the oxygen implant will not be substantially annealed out during subsequent regrowth of epitaxial layers on the extrinsic base region.

After the implantation step, the photoresist 316 is removed from the wafers. The wafers are then cleaned in preparation of epitaxial material growth in the manner described above for prior embodiments. It is important that the cleaning process not remove nitride layer 314. Solutions comprising hydrofluoric acid are known to etch nitride, and so should be avoided. After cleaning, the wafers are loaded into an epitaxial growth chamber (in a system such as for MBE, MOCVD, MOMBE, and so forth) where a passivation layer 322 of p$^+$ AlGaAs, for example, and a base contact layer 324 of p$^+$GaAs, for example, are deposited as shown in FIG. 5e. It may be appreciated that the doping concentration of layers 322 and 324 is subject to optimization based on the requirements of transistor performance. Carbon is the preferred dopant for the regrowth layers, with doping densities in the range of approximately $1 \times 10^{17}$ to $5 \times 10^{20}$ atoms-cm$^{-3}$. Alternative dopants include beryllium and zinc. The overgrowth can include all GaAs, all AlGaAs, an initial GaAs layer followed by an AlGaAs layer, multiple layers of GaAs or AlGaAs, or other semiconductor materials, depending upon the transistor performance desired, or whether an etch stop layer is required. Nitride 314 prevents the epitaxial growth from forming over the emitter 326 and collector 328 contact regions.

Applicant has discovered that epitaxial growth over a wafer whose surface is predominately covered by a dielectric such as silicon nitride is very difficult. Selective growth is such a situation does not generally occur, but instead polycrystalline GaAs forms over the nitride. In contrast, where just a small portion of the wafer is covered, the epitaxial growth is very selective on the portions of the wafer not covered by nitride and no polycrystalline is deposited on top of the nitride. As a consequence of this phenomenon, the epitaxial material is grown over the majority of the wafer surface and then etched away from areas where it is not needed. The process would be simplified if the growth could be performed only where needed. It is anticipated that epitaxial growth technology will soon develop to enable the simplified process.

After the regrowth of base contact layer 324, the protective nitride layer 314 is removed. Base contact metallization 330 is then formed on the regrown base contact layer 324 as shown in FIG. 5f. Under the conditions where the top regrown extrinsic base layer 324 is very heavily doped (e.g. greater than $1 \times 10^{19}$ cm$^{-3}$), one alignment step can be eliminated by forming the base contacts 330 and the emitter contact 332 simultaneously. For example, if the emitter layer 308 is composed of InGaAs and is doped to a concentration greater than approximately $1 \times 10^{19}$ cm$^{-3}$ and the regrown base contact layer 324 is composed of GaAs and is doped to a concentration greater than approximately $5 \times 10^{19}$ cm$^{-3}$, a single layer of metallization such as TiW could be deposited and both the base and emitter contacts patterned and etched simultaneously. Alternatively, the contacts could be formed in separate processes, or in a liftoff process.

Figure 5H:
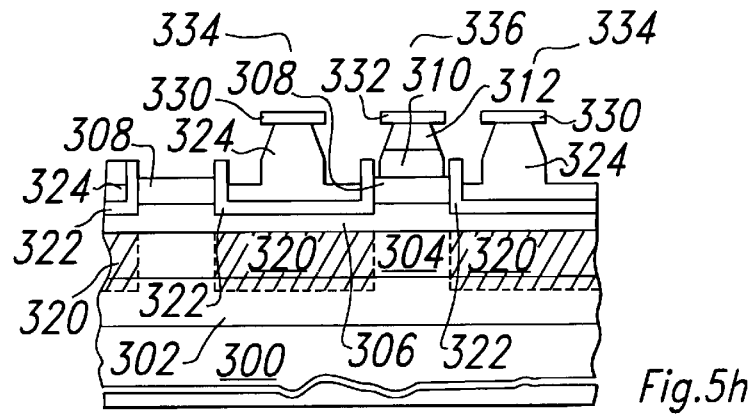

Following formation of the base 330 and emitter 332 contacts, the InGaAs ohmic contact layer 312, and the uppermost portions of the regrown base contact layer 324, are etched using 1:8:160 $H_2SO_4:H_2O_2:H_2O$ as shown in FIG. 5g. A dry etch procedure, such as reactive ion etching, is employed to remove portions of the emitter cap layer 310 that cover the emitter layer 308 as shown in FIG. 5h. Gases such as $SF_6$ in combination with $BCL_3$ etch GaAs significantly faster than AlGaAs. Assuming the material chosen for the emitter layer 308 and the passivation layer 322 is AlGaAs, those layers act as an etch stop. The AlGaAs etch stops prevent etching through the base layer 306, which would destroy the transistor. Inspection of FIG. 5b reveals the relatively vertical sidewalls of the base mesas 334 and emitter mesa 336 resulting from the anisotropic dry etch. Portions of the overgrown base contact layer 324 remain over the passivation layer 322, because even though layers 308 and 322 are used as etch stops, the dry etch is timed to stop after emitter cap layer 310 is cleared from the emitter layer 308.

Figure 5I:
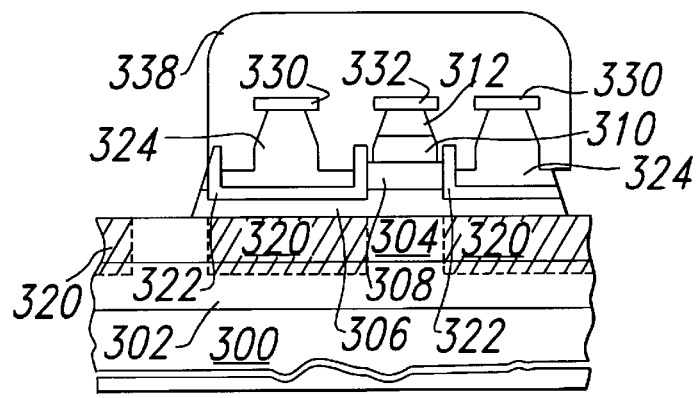
Figure 5J:
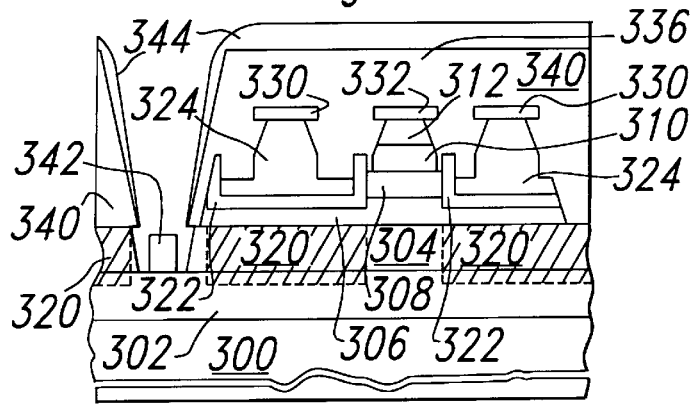
Figure 5K:
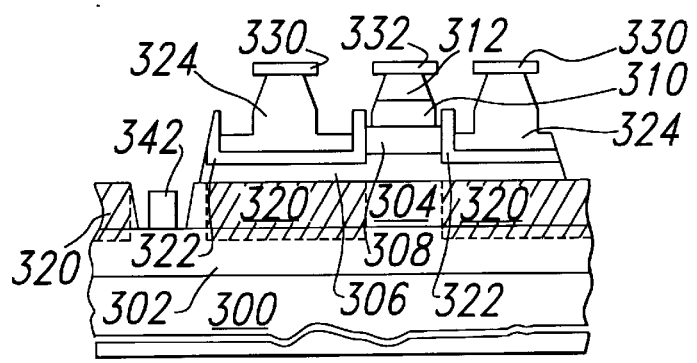

In FIG. 5i, the structure is patterned with photoresist 338 such that only the emitter, base, and extrinsic base regions are covered. A wet etch process is used to remove the layers not covered by the photoresist 338 such that collector layer 320 is exposed. Photoresist 338 is then removed. In FIG. 5j photoresist 340 is patterned in preparation for forming the contact to the subcollector layer 302. Collector layer 304 is removed from the area not covered by photoresist 340. Au/Ni/Ge, for example, is then evaporated to form collector contact metallization 342. Photoresist 340 is then removed to lift off excess metallization 344. The resulting structure is shown in FIG. 5k. After the photoresist 340 is removed, the structure can be heated in a rapid thermal annealing apparatus or in a conventional furnace to anneal the emitter, base, and collector metallization. Resistors, interconnect metallization, and isolation between transistors can be applied using conventional techniques.

Figure 6A:
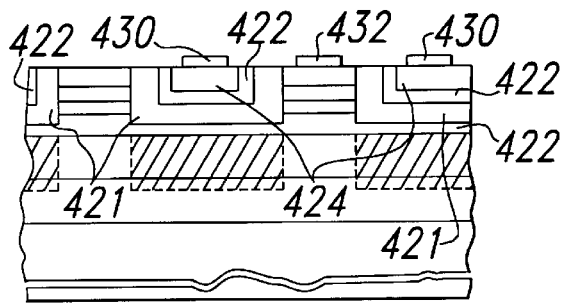
FIGS. 6a–6c are cross-sectional diagrams of a transistor at various stages in a sixth preferred embodiment process.
Figure 6B:
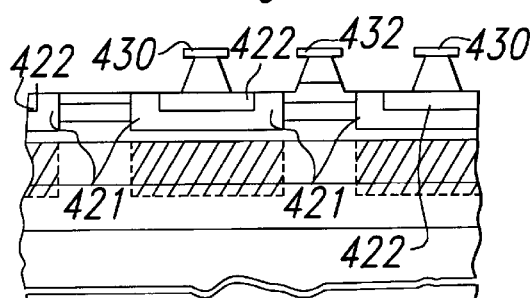

A sixth preferred embodiment process is similar to the fifth, but the process steps shown in FIGS. 5f, 5g and 5h are modified. In FIG. 5b, the emitter layer 308 acts as an etch stop during the removal of the cap layer 310, thus allowing a slight overetch to ensure complete removal of the layer 310 from areas not covered by emitter contact metallization 332. However, during the removal of layer 310, portions of the base contact layer 324 not covered by base metallization 330 are also removed. As shown in FIG. 5h, this process can result in a substantially thinned extrinsic base region between the base mesas 334 and the emitter mesa 336. This thinning could result in an increased extrinsic base resistance. Consequently, in a sixth preferred embodiment process the process steps depicted in FIGS. 5f, 5g, and 5h could be replaced with the steps depicted in FIGS. 6a, 6b, and 6c. In this embodiment, instead of initially growing the AlGaAs passivation layer 322 on base layer 306 as shown in FIG. 5f, a first base contact layer 421 is grown on base layer 406, followed by a passivation layer 422, which is in turn followed by a second base contact layer 424 as shown in FIG. 6a. The first and second base contact layers 421, 424 can be of p+ GaAs, for example, while the passivation layer 422 can be of p type AlGaAs.

Figure 6C:
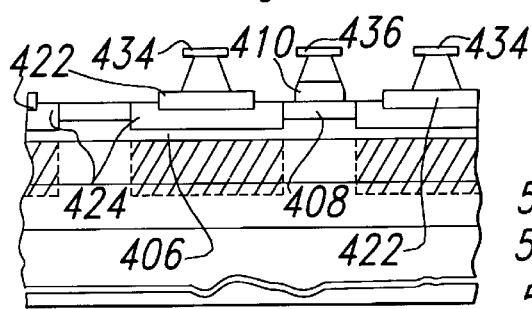

As in the fifth preferred embodiment described hereinabove, the structure of FIG. 6a is uniformly etched with a wet etchant to remove material not covered by emitter metallization 432 or base metallizaton 430. In FIG. 6c, a dry etch procedure, such as reactive ion etching, is employed to remove portions of the emitter cap layer 410 that cover the emitter layer 408. Gases such as $SF_6$ in combination with $BCL_3$ etch GaAs significantly faster than AlGaAs. Assuming the material chosen for the emitter layer 408 and the passivation layer 422 is AlGaAs, those layers act as an etch stop. The use of an AlGaAs etch stop prevents etching though the base layer 406, which would destroy the transistor. Inspection of FIG. 6c reveals the relatively vertical sidewalls of the emitter mesa 436 resulting from the anisotropic dry etch. It is evident from FIG. 6c that the extrinsic base region is thicker than that of the structure of FIG. 5h. The process steps described above and in FIGS. 6a to 6c are especially advantageous for transistors and applications requiring very low base resistance due in part to the thicker extrinsic base region.

Figure 7A:
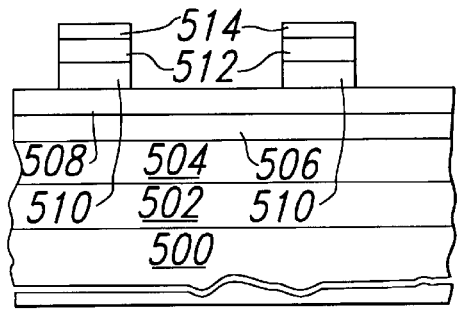
FIGS. 7a–7f are cross-sectional diagrams of a transistor at various stages in a sixth preferred embodiment process.

A seventh preferred embodiment generally parallels the fifth preferred embodiment process described above. Referring to FIG. 7a, the wafers are covered with a dielectric 514 such as plasma-deposited silicon nitride such that the nitride may be removed from all areas except those where the emitter and collector contacts of the transistor are to be formed. The layers overlying the emitter layer 508 are then removed as shown in FIG. 7a. The material may be removed with conventional wet and dry etching processes.

Figure 7B:
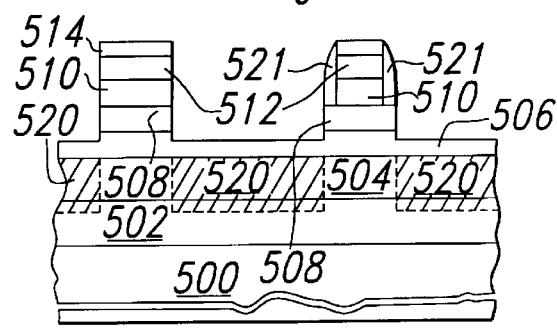

In FIG. 7b, and as in the first preferred embodiment described hereinabove, protective dielectric sidewalls 521 are formed with a conventional technique. The emitter layer 508 is then removed to expose the base layer 506. The emitter layer is removed using a combination of wet and dry plasma etching processes as described above in previous embodiments. It may the appreciated that it is not essential for the etching process to stop exactly at the interface between the emitter 508 and base 506 layers since a new extrinsic base layer is to be deposited in subsequent process steps. Moreover, the base layer 506 may be completely etched through since the subsequently deposited extrinsic base layer can be formed to make electrical contact to the original base layer 506 at the edges of the emitter mesa 526 shown in FIG. 7b. Next, regions 520 are implanted with oxygen, for example, at an energy in the range of approximately 150 keV to 2 MeV to damage the collector layer 504 that lies beneath the extrinsic portion of the base layer 506. The damaged collector layer is rendered semi-insulating and thereby reduces the extrinsic base-collector capacitance of the transistor.

Figure 7C:
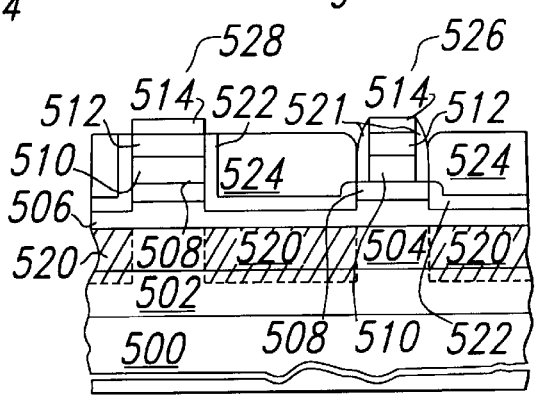
Figure 7D:
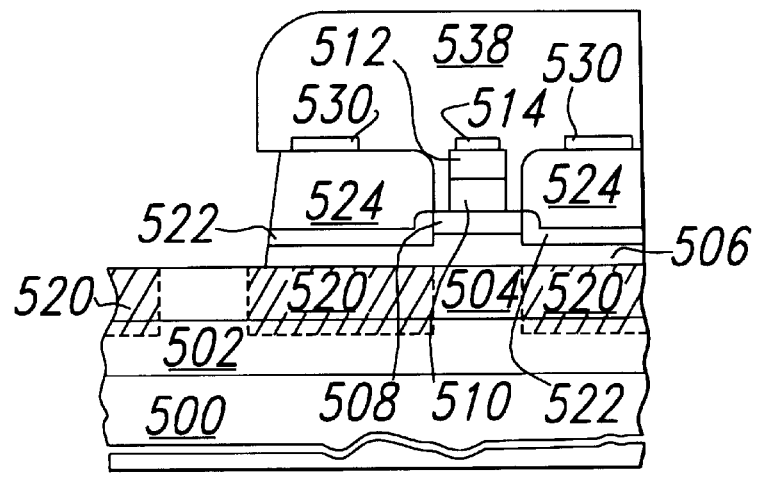

Following the etching to expose base layer 506 and the implantation step, the wafers are cleaned in preparation of epitaxial material growth. It is important that the cleaning process not remove nitride layer 514 and sidewalls 521. Solutions comprising hydrofluoric acid are known to etch nitride, and so should be avoided. After cleaning, the wafers are loaded into an epitaxial growth chamber (in a system such as for MBE, MOCVD, MOMBE, and so forth) where a passivation layer 522 of p+ AlGaAs, for example, and a base contact layer 524 of p+GaAs, for example, are deposited as shown in FIG. 7c. It may be appreciated that the doping concentration of layers 522 and 524 is subject to optimization based on the requirements of transistor performance, but is typically in the range of approximately $1 \times 10^{16}$ to $1 \times 10^{20}$ atoms-$cm^{-3}$. Similarly, the overgrowth can include all GaAs, all AlGaAs, an initial GaAs layer followed by an AlGaAs layer, multiple layers of GaAs or AlGaAs, or other semiconductor materials, depending upon such things as transistor performance, or whether an etch stop layer is required. The dielectric 514 and sidewalls 521 prevent the epitaxial growth from forming over the emitter 526 and collector 528 contact regions, as well as on the sidewalls of the emitter cap 510 and ohmic contact layers 512. This feature of the embodiment process eliminates the step of etching the emitter cap layer 510 from above portions of emitter layer 508 as was done in the fifth and sixth preferred embodiment processes and as is shown in FIGS. 5h and 6c.

Figure 7E:
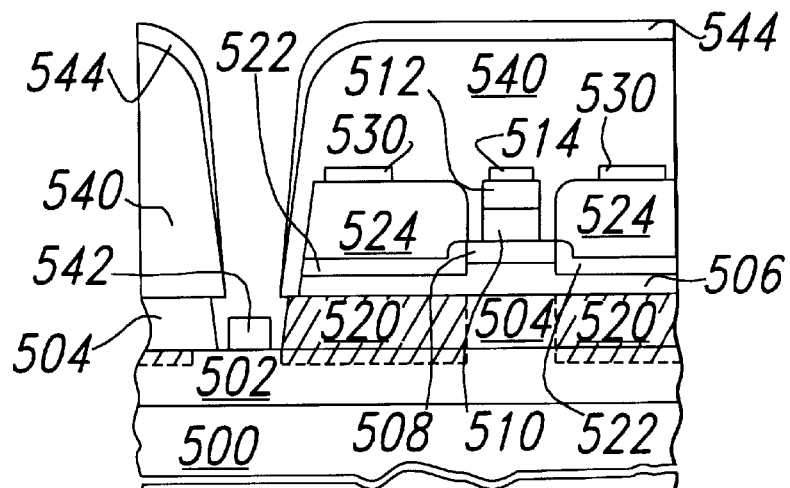
Figure 7F:
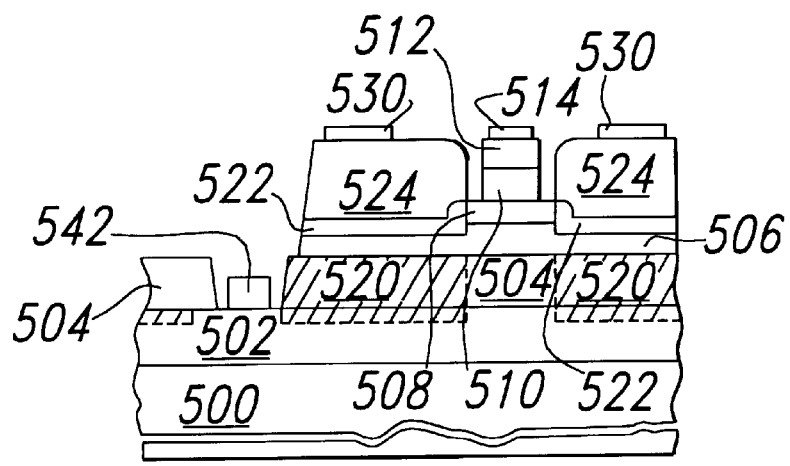

Following the epitaxial growth of layers 522 and 524, the dielectric sidewalls 521 may be removed. Base contact metallization 530 is formed in a conventional manner on base contact layer 524 as shown in FIG. 7c. Photoresist 538 is applied and the portions of the matter structure not covered by photoresist 538 are etched to expose the collector layer 504. Photoresist 538 is stripped and photoresist 540, shown in FIG. 7e, is applied and patterned for the formation of the collector contact 542. Collector layer 504 is etched to expose subcollector layer 502. Collector contact metallization 542 (typically Au, Ge and Ni layers) is then formed using a technique such as evaporation. Photoresist 540 is then removed, thereby lifting off excess metallization 544 as shown in FIG. 7f. Interconnecting metallization, resistors, capacitors, and other peripheral components may then be formed in a conventional manner.

A few preferred embodiments have been described in detail hereinabove. It is to be understood that the scope of the invention also comprehends embodiments different from those described, yet within the scope of the claims.

Internal and external connections can be ohmic, capacitive, inductive, direct or indirect, via intervening circuits or otherwise. Implementation is contemplated in discrete components or fully integrated circuits in gallium arsenide, indium phosphide or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass these and other such modifications or embodiments.

What is claimed is:

1. A bipolar transistor, comprising:

(a) one of an emitter or collector region at an exposed surface of a base layer;

(b) semi-insulating regions in said base layer adjacent to said one of an emitter or collector region, spaced from said one of said emitter or collector region and aligned with a perimeter of said emitter or collector region;

(c) an epitaxial layer of semiconductor material over said semi-insulating regions; and (d) a base contact over said layer of semiconductor material.

2. The transistor of claim 1, further comprising a second epitaxial layer of semiconductor material interposed between said layer of semiconductor material and said base contact.

3. The transistor of claim 1, further comprising a second epitaxial layer of semiconductor material interposed between said semi-insulating regions in said base layer and said epitaxial layer of semiconductor material.

4. The transistor of claim 1, wherein said emitter region comprises a mesa of semiconductor material at said surface of said base layer, said mesa including an emitter layer.

5. The transistor of claim 4, wherein said epitaxial layer of semiconductor material abuts said base layer and an edge of said mesa at said emitter layer.

6. The transistor of claim 1, wherein said base layer is GaAs and said epitaxial layer of semiconductor material is AlGaAs.

7. The transistor of claim 3, wherein said second layer of epitaxial semiconductor material abuts said base layer and an edge of said mesa at said emitter layer.

8. The transistor of claim 3, wherein said base layer is GaAs and said second layer of epitaxial semiconductor material is GaAs.

* * * * *